United States Patent
Imi et al.

(10) Patent No.: US 10,827,614 B2
(45) Date of Patent: Nov. 3, 2020

(54) PRINTED CIRCUIT BOARD

(71) Applicants: Kabushiki Kaisha Toshiba, Minato-ku, Tokyo (JP); Toshiba Electronic Devices & Storage Corporation, Minato-ku, Tokyo (JP)

(72) Inventors: Hitoshi Imi, Yokohama Kanagawa (JP); Motochika Okano, Tokyo (JP); Toshihiro Tsujimura, Tokyo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/298,412

(22) Filed: Mar. 11, 2019

(65) Prior Publication Data

US 2020/0092996 A1 Mar. 19, 2020

(30) Foreign Application Priority Data

Sep. 19, 2018 (JP) .................................. 2018-175445

(51) Int. Cl.
| | | |
|---|---|---|
| H05K 1/00 | (2006.01) | |
| H05K 1/02 | (2006.01) | |
| H05K 1/11 | (2006.01) | |
| H05K 1/16 | (2006.01) | |
| H05K 3/00 | (2006.01) | |
| H05K 3/20 | (2006.01) | |
| H05K 3/46 | (2006.01) | |
| H05K 7/00 | (2006.01) | |
| H05K 7/02 | (2006.01) | |

(52) U.S. Cl.
CPC .............. *H05K 1/115* (2013.01); *H05K 1/021* (2013.01)

(58) Field of Classification Search
CPC ... H05K 1/00; H05K 1/02; H05K 1/11; H05K 1/16; H05K 3/00; H05K 3/20; H05K 3/46; H05K 7/00; H05K 7/02
USPC ....... 174/261, 251, 255, 258, 259, 260, 262, 174/264, 266; 361/679.01, 720, 728, 788
See application file for complete search history.

(56) References Cited

U.S. PATENT DOCUMENTS 5,858,816 A * 1/1999 Sato .................... H01L 21/4803
438/125
7,196,906 B1 * 3/2007 Alexander ............. H05K 1/024
361/760

(Continued)

FOREIGN PATENT DOCUMENTS

| JP | S58-114496 A | 7/1983 |
|---|---|---|
| JP | H05-259599 A | 10/1993 |

(Continued)

*Primary Examiner* — Xiaoliang Chen
(74) *Attorney, Agent, or Firm* — White & Case LLP

(57) ABSTRACT

A printed circuit board of an embodiment includes a board, a first ground plane provided on a first face of the board and having a first opening, a first wiring provided above the first ground plane, a second ground plane provided on a second face facing the first face of the board and having a second opening, a second wiring provided above the second ground plane, and a third wiring penetrating the board between the first opening and the second opening and connecting the first wiring and the second wiring. The third wiring is provided in the first opening and in the second opening when viewed from a direction perpendicular to the first face of the board.

16 Claims, 3 Drawing Sheets

(56) References Cited

U.S. PATENT DOCUMENTS

| | | | | | |
|---|---|---|---|---|---|
| 7,336,502 B1* | 2/2008 | Goergen | H05K 1/0251 | | 361/780 |
| 7,435,913 B2* | 10/2008 | Chong | H01R 12/526 | | 174/260 |
| 8,222,535 B2* | 7/2012 | Frech | G06F 1/10 | | 174/261 |
| 8,431,834 B2* | 4/2013 | Twardy | H05K 1/0268 | | 174/266 |
| 9,875,958 B1* | 1/2018 | Buvid | H01L 23/49838 | | |
| 10,290,572 B2* | 5/2019 | Buvid | H01L 23/49838 | | |
| 2001/0005545 A1* | 6/2001 | Andou | H05K 3/20 | | 428/209 |
| 2003/0072130 A1* | 4/2003 | Tsang | G06F 17/5036 | | 361/679.01 |
| 2005/0139390 A1* | 6/2005 | Kim | H01L 23/49827 | | 174/262 |
| 2005/0201065 A1* | 9/2005 | Regnier | H05K 1/0222 | | 361/720 |
| 2005/0202722 A1* | 9/2005 | Regnier | H05K 1/0222 | | 439/607.05 |
| 2006/0237223 A1* | 10/2006 | Chen | H05K 1/0218 | | 174/255 |
| 2006/0237227 A1* | 10/2006 | Zhao | H05K 1/0222 | | 174/262 |
| 2007/0193775 A1* | 8/2007 | Chen | H05K 1/0222 | | 174/262 |
| 2008/0245556 A1* | 10/2008 | Bird | H05K 1/113 | | 174/262 |
| 2008/0289869 A1* | 11/2008 | Hsu | H05K 1/0222 | | 174/262 |
| 2010/0314163 A1* | 12/2010 | Twardy | H05K 1/0268 | | 174/266 |
| 2010/0321910 A1* | 12/2010 | Hsu | H05K 1/0231 | | 361/782 |
| 2012/0003848 A1* | 1/2012 | Casher | H05K 1/0222 | | 439/65 |
| 2012/0118622 A1* | 5/2012 | Gruendler | H05K 1/162 | | 174/260 |
| 2013/0056255 A1* | 3/2013 | Biddle | H05K 1/0245 | | 174/266 |
| 2014/0231126 A1* | 8/2014 | Hunrath | H05K 3/4614 | | 174/264 |
| 2015/0250055 A1* | 9/2015 | Hidaka | H05K 1/0251 | | 174/251 |
| 2016/0150633 A1* | 5/2016 | Cartier, Jr. | H05K 1/0222 | | 174/251 |
| 2016/0157336 A1* | 6/2016 | Murai | H05K 1/0234 | | 361/782 |
| 2016/0314231 A1* | 10/2016 | Tsang | G06F 17/5036 | | |
| 2016/0374199 A1* | 12/2016 | Kondo | H01R 24/50 | | |

FOREIGN PATENT DOCUMENTS

| | | |
|---|---|---|
| JP | H06-046674 B2 | 6/1994 |
| JP | 2005-191518 A | 7/2005 |

* cited by examiner

PRINTED CIRCUIT BOARD

CROSS-REFERENCE TO RELATED APPLICATION

This application is based upon and claims the benefit of priority from Japanese Patent Application No. 2018-175445, filed on Sep. 19, 2018, the entire contents of which are incorporated herein by reference.

FIELD

Embodiments described herein relate generally to a printed circuit board.

BACKGROUND

Printed circuit boards are also used for devices which perform information communication such as a local area network (LAN). In recent years, further increase in communication speed is demanded, and a printed circuit board, in which impedance mismatch is suppressed in a high frequency band also in a via wiring, is demanded.

DETAILED DESCRIPTION

Figure 1:
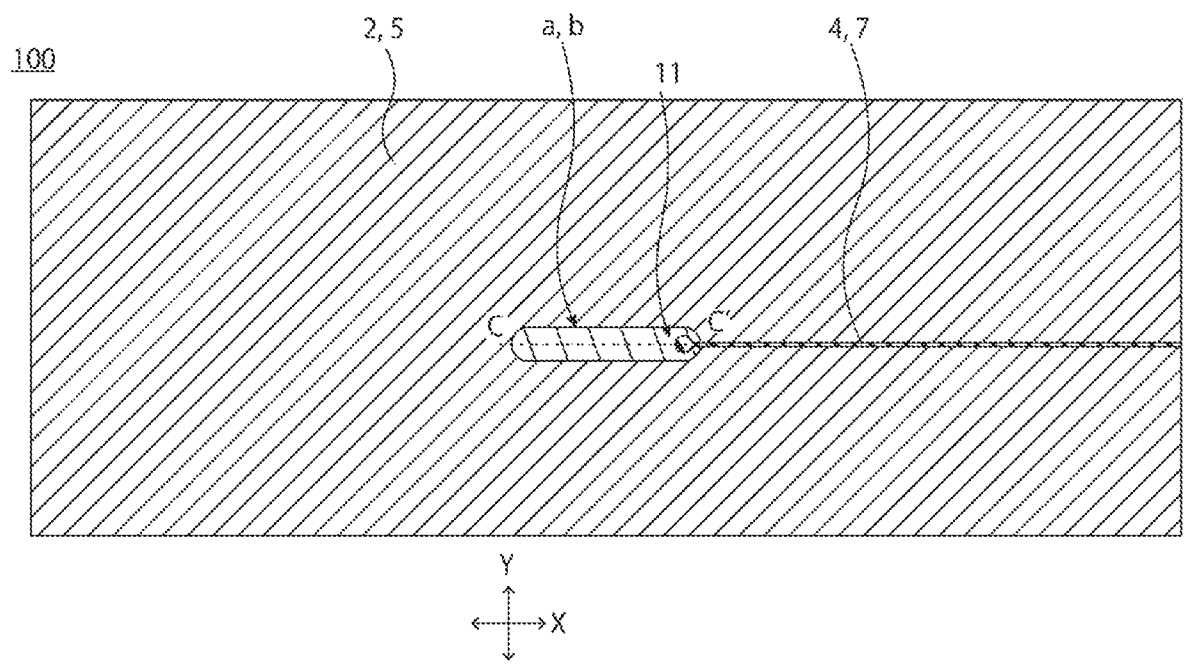
FIG. 1 is a view showing a main part of a printed circuit board 100 according to one embodiment.

A printed circuit board of an embodiment includes a board, a first ground plane provided on a first face of the board and having a first opening, a first wiring provided above the first ground plane, a second ground plane provided on a second face facing the first face of the board and having a second opening, a second wiring provided above the second ground plane, and a third wiring penetrating the board between the first opening and the second opening and connecting the first wiring and the second wiring. The third wiring is provided in the first opening and in the second opening when viewed from a direction perpendicular to the first face of the board.

Hereinafter, one embodiment of the present disclosure will be described with reference to the drawings. Note that scale size, vertical and horizontal dimensional ratios and the like are changed from the actual ones as appropriate to exaggerate in the drawings accompanying this specification for convenience of illustration and ease of understanding.

Hereinafter, embodiments will be described using the drawings. Note that the same or similar parts are denoted by the same or similar reference signs in the drawings.

In this specification, the same or similar members are denoted by the same reference sings, and redundant explanations may be omitted in some cases.

In this specification, the concepts of "upper" and "lower" are not necessarily terms indicating the relationship with the direction of gravity.

Moreover, for example, terms such as "parallel," "orthogonal" and "same," values of lengths and angles, and the like, which specify shapes, geometrical conditions and degrees of these, are interpreted including a range to an extent that can expect the same functions without being bound by the meanings in strict sense.

Embodiments

Figure 2:
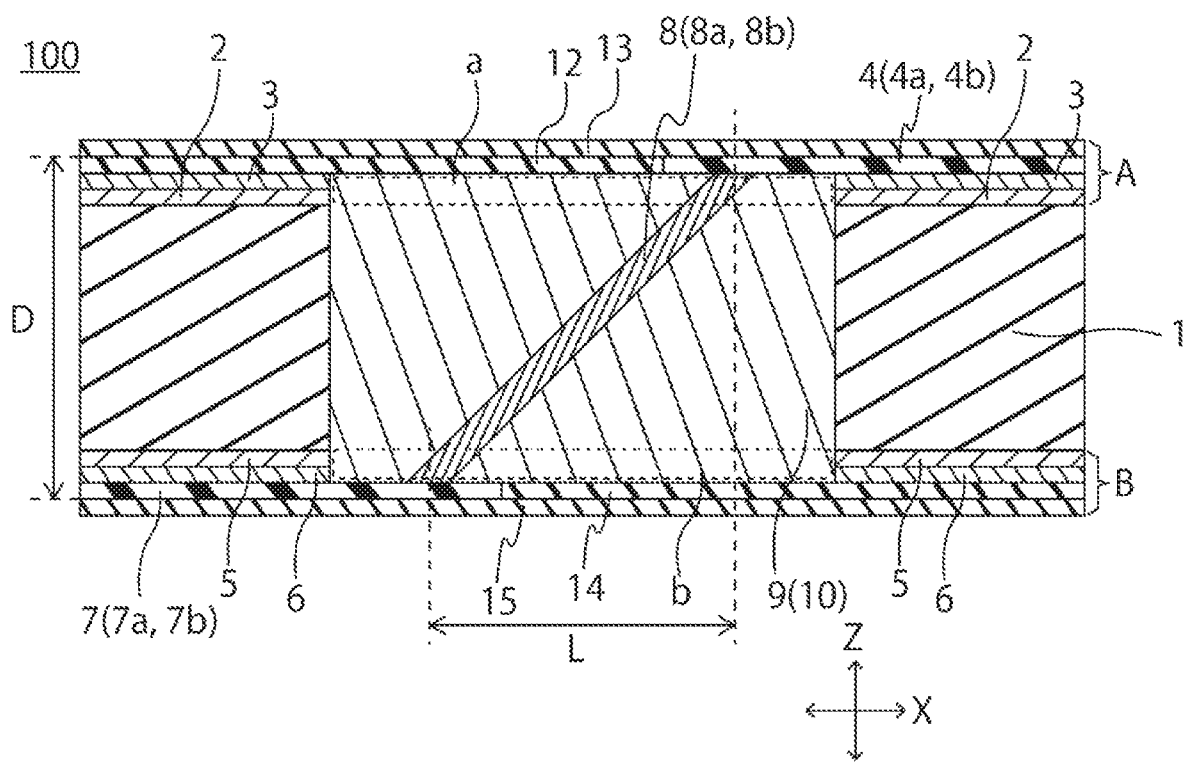
FIG. 2 is a sectional view along the line C-C' in FIG. 1.
Figure 3:
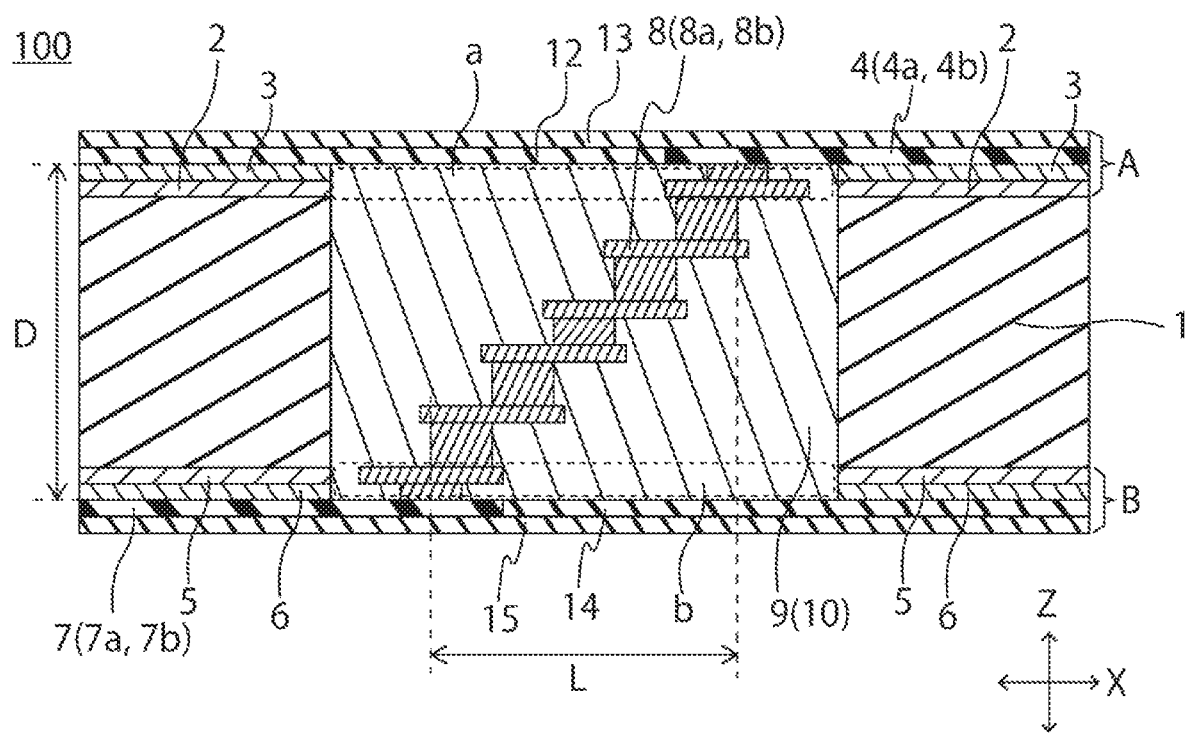
FIG. 3 is a sectional view along the line C-C' in FIG. 1.
Figure 4:
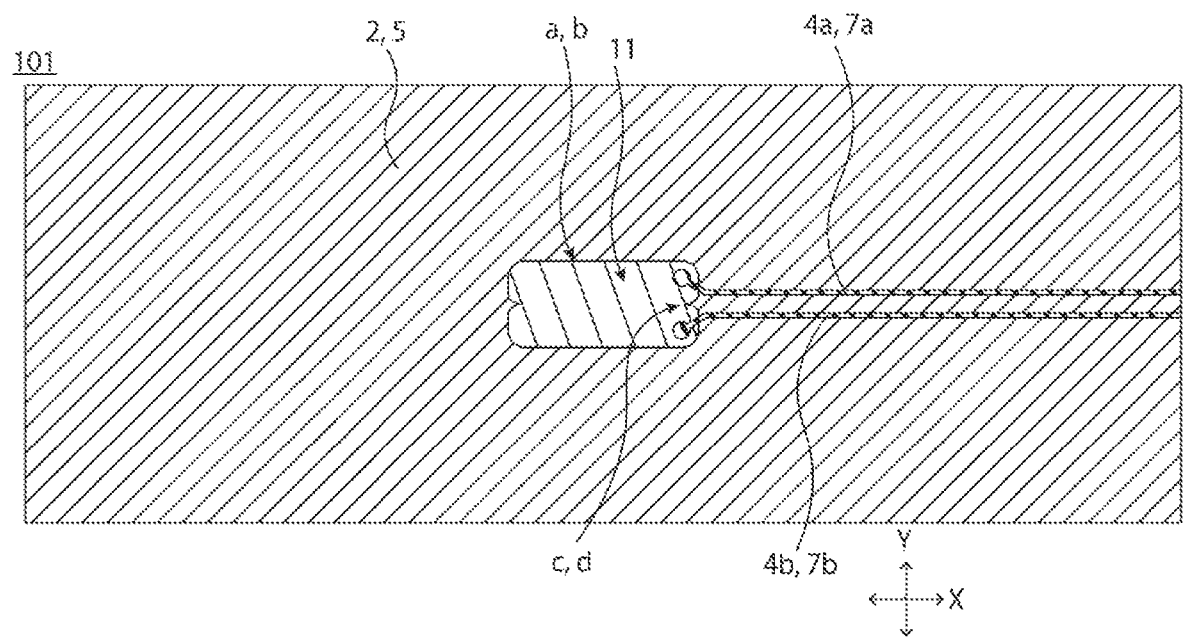
FIG. 4 is a view showing a main part of a printed circuit board 101 according to one embodiment.

FIGS. 1 to 4 are views of main parts of printed circuit boards 100 and 101 according to one embodiment. FIG. 1 is a view showing the main part of the printed circuit board 100. FIG. 1 shows the printed circuit board 100 around a via contact 11. FIG. 2 is one example at a sectional view along the line C-C' in FIG. 1. FIG. 3 is one example at a sectional view along the line C-C' in FIG. 1. FIG. 4 is a view in which the wiring of the via contact 11 in FIG. 1 is a differential wiring. Note that a second insulating film 12 to a seventh insulating film 15 are omitted in FIG. 1.

A first direction X, a second direction Y and a third direction Z cross each other. The first direction X, the second direction Y and the third direction Z are preferably directions orthogonal to each other.

The printed circuit boards 100 and 101 in FIGS. 1, 2, 3 and 4 include a via contact extending in an oblique direction not facing the ground plane, and impedance mismatch is suppressed in a high frequency band.

The printed circuit boards 100 and 101 in FIGS. 1, 2, 3 and 4 include a board 1, a first ground plane 2, a first wiring 4, a second ground plane 5, a second wiring 7 and the via contact 11. The board 1 has a first face A which is the surface side, and a second face B which is the back surface side. The via contact 11 penetrates the board 1 and has a third wiring 8 and a first insulating film 10.

The board 1 is a base material of the printed circuit boards 100 and 101. The board 1 is a laminated board spread in the first direction X and the second direction Y and laminated plurally in the third direction Z. The first direction X and the second direction Y are parallel to the board 1. The third direction Z is the thickness direction of members including the board 1. The board 1 has the first face A and the second face B facing each other. The third direction Z is a direction perpendicular to the first face A of the board 1. The first face A may include the outermost surface or the surface of one layer constituting the laminated board. The second face B may include the backmost surface of the board 1 or the back surface of one layer constituting the laminated board. The board 1 is, for example, a glass epoxy board or the like.

The first ground plane 2 is a conductive layer provided on the first face A of the board 1. The first ground plane 2 is, for example, a solid film constituted by a conductive member such as Cu.

The first wiring 4 is a conductive member provided above the first ground plane 2. The first wiring 4 is a signal transmission path. The first wiring 4 is a wiring provided on the first face A side of the board 1. A fourth insulating film 3 such as a resist is disposed between the first wiring 4 and the first ground plane 2. The first wiring 4 is a conductive member such as Cu.

A first opening a is an opening provided in the first ground plane 2. The first opening a and a through hole 9 penetrating the board 1 are linked.

The second ground plane 5 is a conductive layer disposed on the second face B of the board 1. The second face B faces the first face A in the third direction Z. The second ground plane 5 is a solid film constituted by a conductive member such as Cu.

The second wiring 7 is a conductive member provided above the second ground plane 5. The second wiring 7 is a signal transmission path. The second wiring 7 is a wiring provided on the second face B side of the board 1. A fifth insulating film 6 is disposed between the second wiring 7 and the second ground plane 5. The second wiring 7 is a conductive member such as Cu.

A second opening b is an opening of the second ground plane 5 at the second face B. The second opening b and the through hole 9 opening the board 1 are linked.

The via contact 11 has the through hole 9 penetrating the board 1, the third wiring 8 and the first insulating film 10 in the through hole 9. The via contact 11 is electrically connected to the first wiring 4 on the first face A side of the board 1 and is electrically connected to the second wiring 7 on the second face B side. By adopting the configurations of the embodiments, the impedance mismatch is suppressed at the via contact 11.

The through hole 9 is a hole penetrating a region of the board 1, which is sandwiched between the first opening a and the second opening b. The through hole 9 is integral with the first opening a and the second opening b. The inside of the through hole 9 is preferably constituted by the third wiring 8 and the first insulating film 10. If a conductive member other than the third wiring 8 is included in the through hole 9, this conductive member and the third wiring 8 become capacitors, resulting in impedance mismatch. In the embodiments, since the inside of the through hole 9 is constituted by the third wiring 8 and the first insulating film 10, the impedance mismatch caused by the third wiring 8 is suppressed.

The third wiring 8 is a conductive member penetrating the board 1 between the first opening a and the second opening b and connecting the first wiring 4 and the second wiring 7. The third wiring 8 is a conductive member in the via contact 11. The third wiring 8 is a signal transmission path. The third wiring 8 is electrically connected to the first wiring 4 above the first opening a on the first face A side. The third wiring 8 is also electrically connected to the second wiring 7 above the second opening b of the second face B. The third wiring 8 extends in the direction parallel to the first face A of the board 1 and in the direction perpendicular to the first face A of the board 1 (the first direction X and the third direction Z in the drawings). That is, the third wiring 8 extends in an oblique direction. The direction parallel to the first face A of the board 1 (the first direction X) is the length direction of the third wiring 8, and a length of the third wiring 8 in the length direction is L. The direction perpendicular to the first face A of the board 1 (the third direction Z) is the depth direction of the third wiring 8, and a length of the third wiring 8 in the thickness direction is D.

For example, as shown in FIG. 2, the third wiring 8 can be constituted by a linear member sandwiched between the first wiring 4 and the second wiring 7. The linear member extends in the first direction X and the third direction Z.

In addition to the mode in which the constituent member extends obliquely, the third wiring 8 may adopt a step-like constituent member. As shown in FIG. 3, the third wiring 8 can be extended in an oblique direction by combining and disposing placoid members (members with a longer cross section diameter) and columnar members (with a shorter cross section diameter) to be step-like. The third wiring 8 is a conductive member such as Cu.

The third wiring 8 may be solid or hollow.

The first insulating film 10 covers the third wiring 8 in the through hole 9. The first insulating film 10 is, for example, a resist.

The third wiring 8 is preferably provided in the first opening a and the second opening b when the printed circuit board 100 is viewed from a direction perpendicular to the first face A of the board 1. That is, the third wiring 8 preferably faces the first opening a and the second opening b in the third direction Z. The third wiring 8 faces the first opening a and the second opening b so that the third wiring 8 faces neither the first ground plane 2 nor the second ground plane 5. The third wiring 8 does not face the ground planes so that the capacity (electric capacity) between the third wiring 8 and the first ground plane 2 and the capacity (electric capacity) between the third wiring 8 and the second ground plane 5 are reduced. The capacities are reduced so that the impedance mismatch between the first wiring 4 and the second wiring 7 sandwiching the via contact 11 is suppressed. In order to suppress the impedance mismatch, the following configuration is more preferably adopted.

The distance between the first ground plane 2 and the third wiring 8 is preferably longer than the distance between the first ground plane 2 and the first wiring 4. If the distance between the first ground plane 2 and the third wiring 8 is equal to or less than the distance between the first ground plane 2 and the first wiring 4, even when a metal or the like is does not, on the first opening a side, face the first ground plane 2 with a large area, the capacity between the third wiring 8 and the first ground plane 2 is increased, and the impedance mismatch tends to increase. For the same reason, the distance between the second ground plane 5 and the third wiring 8 is preferably longer than the distance between the second ground plane 5 and the second wiring 7. For the same reason, the distance between the third wiring 8 and the first ground plane 2 is preferably greater than 1.0 and equal to or less than 1.2 when the distance between the first ground plane 2 and the first wiring 4 is 1. Similarly, the distance between the third wiring 8 and the second ground plane 5 is preferably greater than 1.0 and equal to or less than 1.2 when the distance between the second ground plane 5 and the second wiring 7 is 1.

If the length of the third wiring 8 in the direction parallel to the first face A of the board 1 (the first direction X) is short, it becomes close to the vertical via, and the impedance mismatch tends to become large. Therefore, the ratio of the length L of the third wiring 8 in the direction parallel to the first face A of the board 1 (the first direction X) to the length D of the third wiring 8 in the direction perpendicular to the first face A of the board 1 (the third direction Z), which is obtained by [the length L of the third wiring 8 in the direction parallel to the first face A of the board 1 (the first direction X)]/[the length D of the third wiring 8 in the direction perpendicular to the first face A of the board 1 (the third direction Z)], is preferably equal to or greater than 0.5 and equal to or less than 2.0, more preferably equal to or greater than 0.9 and equal to or less than 1.1, and further more preferably equal to or greater than 0.99 and equal to or less than 1.01.

Moreover, the third wiring 8 preferably does not face a conductive member except for the first wiring 4 and the second wiring 7 in a direction perpendicular to the first face A of the board 1 (the third direction Z). If the third wiring 8 faces a conductive members (not shown) in the third direction Z, the impedance characteristics of the third wiring 8 tends to deteriorate.

From the viewpoint of suppressing the impedance mismatch as described above, the face of the via contact 11 on the first face A side is preferably not in contact with a conductive member other than the first wiring 4. Therefore, as shown in the drawings, the face of the via contact 11 on the first face A side is preferably in contact with a part of the first wiring 4 and the second insulating film 12. The first face A side of the third wiring 8 preferably faces the first wiring 4 and the second insulating film 12. The second insulating film 12 is, for example, disposed in the same layer as the first wiring 4 and is disposed on the via contact 11 on the first face A side. The entire face of the via contact 11 on the first face A side is more preferably in direct contact with a part of the first wiring 4 and a part of the second insulating film 12. Furthermore, a sixth insulating film 13 is preferably disposed on the first wiring 4 and the second insulating film 12.

As for the second face B side which is the back surface side, the face of the via contact 11 on the second face B side is similarly preferably not in contact with a conductive member other than the second wiring 7. Therefore, as shown in the drawings, the face of the via contact 11 on the second face B side is preferably in contact with a part of the second wiring 7 and a third insulating film 14. The second face B side of the third wiring 8 preferably faces the second wiring 7 and the third insulating film 14. The third insulating film 14 is, for example, disposed in the same layer as the second wiring 7 and is disposed on the via contact 11 on the second face B side. The entire face of the via contact 11 on the second face B side is more preferably in direct contact with a part of the second wiring 7 and a part of the third insulating film 14. Moreover, a seventh insulating film 15 is preferably disposed on the second wiring 7 and the third insulating film 14.

Furthermore, from the viewpoint of suppressing the impedance mismatch, it is preferable that the third direction Z, which is the direction perpendicular to the first face A of the board 1, be orthogonal to the first direction X and the second direction Y, and the entire face of the first opening a and the entire face of the second opening b face each other in the third direction Z. When the entire faces of the opening portions face each other in the direction perpendicular to the first face A of the board 1 (the third direction), the third wiring 8 faces neither the first ground plane 2 nor the second ground plane 5 in the direction perpendicular to the first face A of the board 1 (the third direction Z), which is preferable from the viewpoint of the impedance characteristics.

Further, since the first wiring 4 (the second wiring 7) and the third wiring 8 are directly connected, they partially face each other. However, if the facing ratio is large, the impedance mismatch tends to be large. Therefore, the facing distance between the first wiring 4 and the third wiring 8 in the direction perpendicular to the first face A of the board 1 (the third direction Z) is preferably equal to or less than 0.2 L. From the same viewpoint, the facing distance between the second wiring 7 and the third wiring 8 in the direction perpendicular to the first face A of the board 1 (the third direction Z) is preferably equal to or less than 0.2 L.

FIG. 1 shows the via contact of a single end wiring, but the printed circuit board according to the embodiment can also be applied to a differential wiring as shown in FIG. 4. In the case of differential wiring, the first wiring 4 includes a first signal line 4a and a second signal line 4b which are aligned in parallel in the second direction Y, the second wiring 7 includes a third signal line 7a and a fourth signal line 7b which are aligned in parallel in the second direction Y, and the third wiring 8 includes a fifth signal line 8a and a sixth signal line 8b which are aligned in parallel in the second direction Y. Then, the fifth signal line 8a is connected to the first signal line 4a and the third signal line 7a, and the sixth signal line 8b is connected to the second signal line 4b and the fourth signal line 7b.

In both of the single end wiring and the differential wiring, the impedance of the first wiring 4 tends to be high when the first wiring 4 and the first ground plane 2 are far from each other. In the differential wiring, two parallel wirings are preferably disposed at equal intervals, but the tip portions of the first wiring 4 and the second wiring 7 connected to the third wiring 8 are, for examples, spread in a circular shape and tend to be far from the ground planes. The first ground plane 2 preferably has a first protrusion c extending in the direction parallel to the first face A of the board 1 (the first direction X), between the first signal line 4a and the second signal line 4b so that the distance between the ground plane and the wiring is shorted also on the tip side. As for the back surface side, the second ground plane 5 similarly preferably has a second protrusion d extending in the direction parallel to the first face A of the board 1 (the first direction X), between the third signal line 7a and the fourth signal line 7b.

Figure 5:
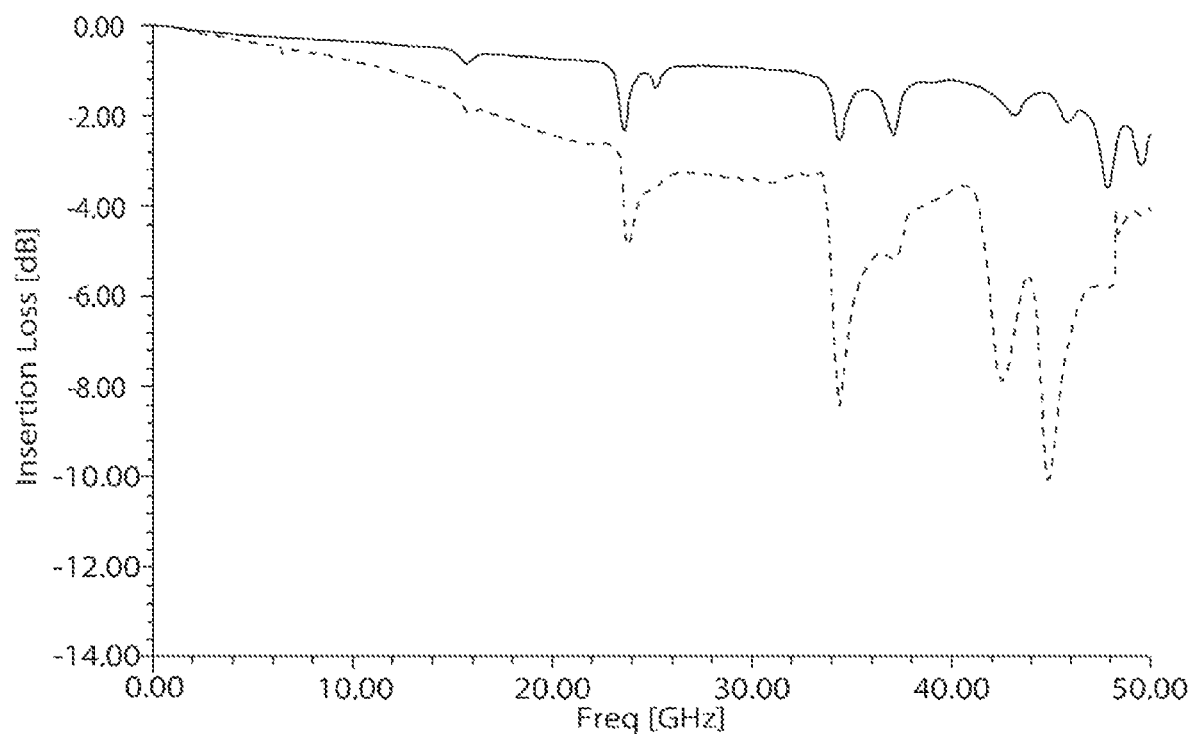
FIG. 5 is a diagram showing the results of the pass characteristics of printed circuit boards.

FIG. 5 shows the results of the pass characteristics including ones in the high frequency band. The solid line indicates the results of the printed circuit board of the differential wiring having the oblique via contact, and the broken line indicates the results of a printed circuit board of a differential wiring having an oblique via contact in which ground planes are formed so as to surround the peripheries of wirings (corresponding to the first wiring 4 and the second wiring 7 in the embodiments) and a wiring of the oblique via contact (corresponding to the third wiring 8 in the embodiments) entirely faces the ground planes. The solid line has a remarkable small change in the impedance and shallow dips as compared with the broken line. These results suggest that the printed circuit boards according to the embodiments have excellent impedance characteristics.

Figure 6:
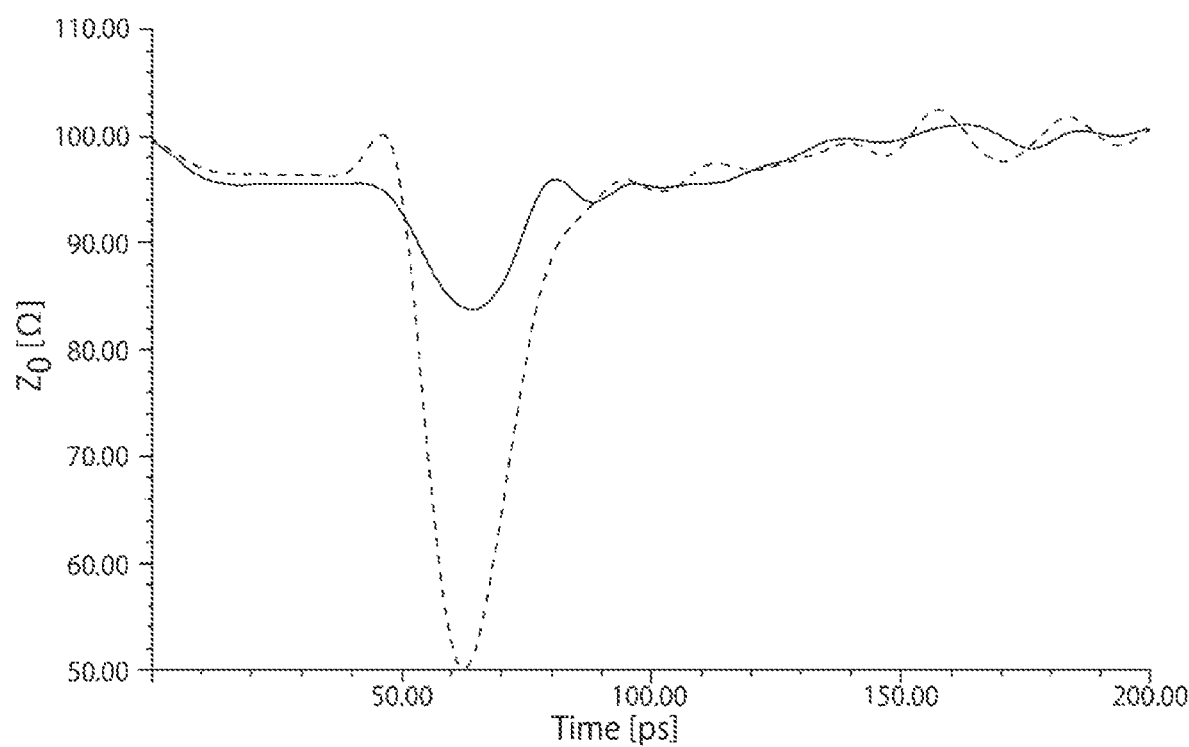
FIG. 6 is a diagram showing the results of the TDR characteristics of printed circuit boards.

FIG. 6 shows the results of time domain reflectometry (TDR). The solid line indicates the results of the printed circuit board of the differential wiring having the oblique via contact, and the broken line indicates the results of a printed circuit board of a differential wiring having an oblique via contact in which ground planes are formed so as to surround the peripheries of wirings (corresponding to the first wiring 4 and the second wiring 7 in the embodiments) and a wiring of the oblique via contact (corresponding to the third wiring 8 in the embodiments) entirely faces the ground planes. The solid line has a shallow dip and high impedance match, but the broken line has a deep dip and impedance match that is not high. These results suggest that the printed circuit boards according to the embodiments have excellent impedance characteristics.

While certain embodiments have been described, these embodiments have been presented by way of example only, and are not intended to limit the scope of the inventions. Indeed, the printed circuit board described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A printed circuit board comprising:
   a board;
   a first ground plane provided on a first face of the board and having a first opening;
   a first wiring provided above the first ground plane;
   a second ground plane provided on a second face facing the first face of the board and having a second opening;

a second wiring provided below the second ground plane; and a third wiring penetrating the board between the first opening and the second opening and connecting the first wiring and the second wiring, wherein the third wiring is provided in the first opening and in the second opening when viewed from a direction perpendicular to the first face of the board, the first wiring includes a first signal line and a second signal line, which are aligned in parallel, the second wiring includes a third signal line and a fourth signal line, which are aligned in parallel, the third wiring includes a fifth signal line and a sixth signal line, which are aligned in parallel, the fifth signal line is connected to the first signal line and the third signal line, the sixth signal line is connected to the second signal line and the fourth signal line, the first ground plane has a first protrusion extending in a direction parallel to the first face of the board, between the first signal line and the second signal line, and the second ground plane has a second protrusion extending in the direction parallel to the first face of the board, between the third signal line and the fourth signal line.

2. The board according to claim 1, wherein a distance between the first ground plane and the third wiring is longer than a distance between the first ground plane and the first wiring, and a distance between the second ground plane and the third wiring is longer than a distance between the second ground plane and the second wiring.

3. The board according to claim 1, wherein a ratio of a length of the third wiring in a direction parallel to the first face of the board to a length of the third wiring in the direction perpendicular to the first face of the board, which is obtained by [the length of the third wiring in the direction parallel to the first face of the board]/[the length of the third wiring in the direction perpendicular to the first face of the board], is equal to or greater than 0.9 and equal to or less than 1.1.

4. The board according to claim 1, wherein the first wiring, the second wiring and the third wiring are differential wirings.

5. The board according to claim 1, wherein the third wiring does not face a conductive material except for the first wiring and the second wiring in the direction perpendicular to the first face of the board.

6. The board according to claim 1, wherein an upper portion of the first opening is covered with a first insulating film and the first wiring, and a lower portion of the second opening is covered with a second insulating film and the second wiring.

7. The board according to claim 1, wherein the fifth signal line and the sixth signal line extend obliquely or step like.

8. The board according to claim 1, wherein the fifth signal line and the sixth signal line extend obliquely.

9. The board according to claim 1, wherein the fifth signal line and the sixth signal line extend in an oblique direction by combining and disposing placoid materials and columnar materials to be step-like.

10. A printed circuit board comprising:
a board;
a first ground plane provided on a first face of the board and having a first opening;
a first wiring provided above the first ground plane, wherein the first wiring includes a first signal line and a second signal line, which are aligned in parallel;
a second ground plane provided on a second face facing the first face of the board and having a second opening;
a second wiring provided below the second ground plane, wherein the second wiring includes a third signal line and a fourth signal line, which are aligned in parallel; and
a third wiring penetrating the board between the first opening and the second opening and connecting the first wiring and the second wiring, wherein the third wiring includes a fifth signal line and a sixth signal line, which are aligned in parallel, and wherein the third wiring is provided in the first opening and in the second opening when viewed from a direction perpendicular to the first face of the board, and the fifth signal line and the sixth signal line extend obliquely; and wherein:
the fifth signal line is connected to the first signal line and the third signal line,
the sixth signal line is connected to the second signal line and the fourth signal line,
the first ground plane has a first protrusion extending in a direction parallel to the first face of the board, between the first signal line and the second signal line, and
the second ground plane has a second protrusion extending in the direction parallel to the first face of the board, between the third signal line and the fourth signal line.

11. The board according to claim 10, wherein a distance between the first ground plane and the third wiring is longer than a distance between the first ground plane and the first wiring, and a distance between the second ground plane and the third wiring is longer than a distance between the second ground plane and the second wiring.

12. The board according to claim 10, wherein a ratio of a length of the third wiring in a direction parallel to the first face of the board to a length of the third wiring in the direction perpendicular to the first face of the board, which is obtained by [the length of the third wiring in the direction parallel to the first face of the board]/[the length of the third wiring in the direction perpendicular to the first face of the board], is equal to or greater than 0.9 and equal to or less than 1.1.

13. The board according to claim 10, wherein the first wiring, the second wiring and the third wiring are differential wirings.

14. The board according to claim 10, wherein the third wiring does not face a conductive material except for the first wiring and the second wiring in the direction perpendicular to the first face of the board.

15. The board according to claim 10, wherein an upper portion of the first opening is covered with a first insulating film and the first wiring, and a lower portion of the second opening is covered with a second insulating film and the second wiring.

16. The board according to claim 10, wherein the fifth signal line and the sixth signal line extend in an oblique direction by combining and disposing placoid materials and, columnar materials to be step-like.

* * * * *